(12) United States Patent
Jeong et al.

(10) Patent No.: US 7,324,395 B2
(45) Date of Patent: Jan. 29, 2008

(54) SEMICONDUCTOR MEMORY DEVICES WITH OPEN BITLINE ARCHITECTURES AND METHODS OF CONTROLLING THE BITLINES OF SUCH SEMICONDUCTOR MEMORY DEVICES

(75) Inventors: Chang-yeong Jeong, Gyeonggi-do (KR); Sung-Wan Joo, Gyeonggi-do (KR); Ji-Hoon Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/463,067

(22) Filed: Aug. 8, 2006

(65) Prior Publication Data
US 2007/0047350 A1 Mar. 1, 2007

(30) Foreign Application Priority Data
Aug. 8, 2005 (KR) .................. 10-2005-0072326

(51) Int. Cl.
*G11C 7/00* (2006.01)
(52) U.S. Cl. ....................... 365/205; 365/203
(58) Field of Classification Search ............... 365/205, 365/203, 207, 208
See application file for complete search history.

(56) References Cited

U.S. PATENT DOCUMENTS

| | | | |
|---|---|---|---|
| 5,953,275 A | | 9/1999 | Sugibayashi et al. |
| 6,449,202 B1 * | | 9/2002 | Akatsu et al. .............. 365/205 |
| 6,606,277 B2 * | | 8/2003 | Takahashi .................. 365/233 |
| 6,847,555 B2 * | | 1/2005 | Toda ...................... 365/185.21 |
| 2003/0095429 A1 | | 5/2003 | Hirose et al. |

FOREIGN PATENT DOCUMENTS

JP 2000-149548 A 5/2000

\* cited by examiner

Primary Examiner—Vu A. Le
(74) Attorney, Agent, or Firm—Myers Bigel Sibley & Sajovec

(57) ABSTRACT

Semiconductor memory devices and methods of controlling bitlines of such devices in which bitlines of a memory cell array adjacent to an activated memory cell array are precharged to the same voltage. The semiconductor memory devices may include: a sense amplifier which is connected between a pair of bitlines, consisting of a bitline of a first memory cell array and a bitline of a second memory cell array; a first separation unit which controls the connection of the bitline of the first memory cell array to the sense amplifier in response to a first separation control signal; a second separation unit which controls the connection of the bitline of the second memory cell array to the sense amplifier in response to a second separation control signal; a first precharge unit which precharges the bitline of the first memory cell array to a predetermined voltage in response to a first precharge signal; and a second precharge unit which precharges the bitline of the second memory cell array to the predetermined voltage in response to a second precharge signal, wherein the second separation unit disconnects the bitline of the second memory cell array from the sense amplifier after a sensing operation performed on the first memory cell array, which is activated, is terminated, and the second precharge unit precharges the bitline of the second memory cell array.

23 Claims, 14 Drawing Sheets

SEMICONDUCTOR MEMORY DEVICES WITH OPEN BITLINE ARCHITECTURES AND METHODS OF CONTROLLING THE BITLINES OF SUCH SEMICONDUCTOR MEMORY DEVICES

CROSS-REFERENCE TO RELATED PATENT APPLICATION

This application claims priority under 35 U.S.C. § 119 to Korean Patent Application No. 10-2005-0072326, filed on Aug. 8, 2005, in the Korean Intellectual Property Office, the disclosure of which is incorporated herein in its entirety by reference.

FIELD OF THE INVENTION

The present invention relates to semiconductor memory devices and, more particularly, to the bitline architecture of semiconductor memory devices and to methods of controlling the bitlines of semiconductor memory devices.

BACKGROUND

The arrangement of sense amplifiers in a semiconductor memory device is determined according to the bitline architecture of the semiconductor memory device. Bitline architectures that can be adopted in semiconductor memory devices include a folded bitline architecture and an open bitline architecture. A method of controlling the voltage of bitline pairs in a semiconductor memory device having an open bitline architecture after performing a sense amplification operation is disclosed in U.S. Pat. No. 5,953,275.

FIG. 1 is a block diagram of a semiconductor memory device that may be used to explain a sense operation performed by a semiconductor memory device having a folded bitline architecture. Referring to FIG. 1, the semiconductor memory device includes a plurality of memory cell arrays designated A (12), B (11), and C (13). The semiconductor memory device also includes a plurality of sense amplifier blocks 21, 22, and 23. Each of the sense amplifiers in the sense amplifier blocks 21, 22, and 23 is allocated to respective corresponding bitline pairs, each comprising a bitline BL and a bitline /BL.

When the memory cell array B (11) is activated, the bitlines BL and /BL in the memory cell array B (11) have opposite voltages. The sense amplifiers of the sense amplifier block 21 that are connected to the memory cell array B (11) sense that the bitlines BL have a high voltage (H) and that the bitlines /BL have a low voltage (L), and amplify a difference between the high voltage H and the low voltage L. The sense amplifier outputs the result of this amplification operation to complete the data sensing operation.

When the memory cell array B (11) is activated, the memory cell array A (12) and the memory cell array C (13), each of which are adjacent to the memory cell array B (11), are disconnected from the sense amplifier blocks 21. Therefore, all the bitline pairs in the memory cell array A (12) and in the memory cell array C (13) remain precharged (P).

FIG. 2 is a circuit diagram of a semiconductor memory device having a conventional open bitline architecture. Referring to FIG. 2, the semiconductor memory device includes a plurality of memory cell arrays 31 and 32, a plurality of sense amplifiers 40, and a plurality of precharge units 50. In FIG. 2, reference character CSL indicates a column selection line, and reference characters LANG and LAPG indicate a pull-down signal and a pull-up signal, respectively. The pull-down signal LANG is applied to the pull-down transistors MN of the sense amplifiers 40, and the pull-up signal LAPG is applied to the pull-up transistors MP of the sense amplifiers 40.

Each of the sense amplifiers 40 are connected between a Bitline of the first memory cell array 31 and a Bitline of the second memory cell array 32. For example, a sense amplifier 40 is connected between bitline BL1 of the first memory cell array 31 and bitline /BL1 of the second memory cell array 32, and performs a data sensing operation. When the first memory cell array 31 stores logic high data, the bitlines BL1 and /BL1 reach a high voltage and a low voltage, respectively.

If the sense amplifier 40 terminates the data sensing operation after a wordline W/L of the first memory cell array 31 is activated, the precharge unit 50 performs a precharge operation in response to a precharge control signal PEQ.

FIG. 3 is a diagram for explaining an embodiment of a sensing operation performed by a conventional semiconductor memory device having an open bitline architecture. Referring to FIG. 3, the semiconductor memory device includes 3 memory cell arrays B (31), A (32), and C (33) and a plurality of sense amplifier blocks 41, 42, 43, and 44.

FIG. 3 illustrates the voltages of bitlines included in the semiconductor memory device when the memory cell array B (31) is activated and has logic high data. When the memory cell array B (31) stores logic high data, the bitlines BL of the memory cell array B (31) all reach a high voltage (H). In the memory cell arrays A (32) and C (33), which are adjacent to the memory cell array B (31), only the bitlines that are connected to the sense amplifier blocks 41 and 42 of memory cell array B (31) reach a low voltage (L), and the other bitlines that are not connected to the sense amplifier blocks 41 and 42 remain precharged. Therefore, in the memory cell arrays A (32) and C (33), bitlines having the low voltage (L) and bitlines having a precharge voltage (P) coexist.

FIG. 4 is a diagram for explaining another embodiment of a sensing operation performed by a conventional semiconductor memory device having an open bitline architecture when a memory cell array B (31) of the semiconductor memory device is activated and has logic low data. FIG. 5 is a diagram for explaining a sensing operation performed by a conventional semiconductor memory device having an open bitline architecture when a memory cell array B (31) is activated and has both logic high data and logic low data.

Referring to FIG. 4, since the memory cell array B (31) has logic low data, all bitlines BL of the memory cell array B (31) reach a low voltage (L) when the memory cell array B (31) is activated. However, bitlines that are included in memory cell array A (32) that are connected to sense amplifier 42, as well as bitlines that are included in memory cell array C (33) that are connected to sense amplifier 41 reach a high voltage (H). Therefore, in the memory cell arrays A (32) and C (33), which are adjacent to the memory cell array B (31), bitlines having the high voltage H and bitlines having the precharge voltage (P) coexist.

Referring to FIG. 5, since the memory cell array B (31) has both logic low data and logic high data, the bitlines BL in memory cell array B (31) have a high voltage (H) or a low voltage (L). On the other hand, the bitlines included in memory cell array A (32) that are connected to sense amplifier 42 reach the high voltage (H). Other bitlines in memory cell array A (32) that are connected to sense amplifier 43 remain precharged (P). Therefore, in memory cell array A (32), bitlines having the high voltage (H) and bitlines having the precharge voltage (P) coexist. In addition, bitlines in memory cell array C (33) that are connected to sense amplifier 41 reach a low voltage (L). Therefore, in the memory cell array C (33), bitlines having the low voltage (L) and bitlines having the precharge voltage (P) coexist.

FIG. 6 is a waveform diagram illustrating a sensing operation performed by the semiconductor memory device of FIG. 2. The sensing operation will now be described in detail with reference to FIGS. 2 and 6. Referring to FIGS. 2 and 6, when a first cell block selection signal PBLSi for activating the memory cell array 31 is activated, the precharge control signal PEQ for controlling the precharge unit 50 is inactivated so that a precharge operation is terminated. The sense amplifier 40 performs a sensing operation in response to a sensing initiation signal PS. If the memory cell array 31 has logic high data, the bitlines BL1 and/BL1, which are connected to the sense amplifier 40, reach the high voltage (H) and the low voltage (L), respectively. In the memory cell array 32, which is adjacent to the memory cell array 31, the bitline /BL1 having the low voltage and a bitline BL3 having the precharge voltage (P) coexist.

As described above, in a memory cell array of a semiconductor memory device having a conventional open bitline architecture, both bitlines having a low voltage and bitlines having a precharge voltage, or both bitlines having a high voltage and bitlines having the precharge voltage, may coexist, if the memory cell array is a memory cell array that is not activated after a sensing operation.

SUMMARY

Pursuant to embodiments of the present invention, semiconductor memory devices having an open bitline architecture are provided which include a first memory cell array, a second memory cell array, and a pair of bitlines comprising a first bitline of the first memory cell array and a second bitline of the second memory cell array. A sense amplifier is connected between the pair of bitlines. The memory device includes a first circuit that is configured to control the connection of the first bitline to the sense amplifier in response to a first control signal, and a second circuit that is configured to control the connection of the second bitline to the sense amplifier in response to a second control signal. The memory device also includes a third circuit that is configured to precharge the first bitline to a predetermined voltage in response to a first precharge signal and a fourth circuit that is configured to precharge the second bitline to the predetermined voltage in response to a second precharge signal. The second circuit is further configured to disconnect the second bitline from the sense amplifier after termination of a sensing operation that is performed on the first memory cell array, which is activated, and the fourth circuit precharges the second bitline after the second bitline is disconnected from the sense amplifier.

The first circuit may comprise a first transistor which has a first electrode that is connected to the first bitline, a second electrode that is connected to the sense amplifier and a control electrode which is responsive to the first control signal. The second circuit may comprise a second transistor which has a first electrode that is connected to the second bitline, a second electrode that is connected to and the sense amplifier and a control electrode which is responsive to the second control signal. The semiconductor device may be configured to turn off the second transistor after the sensing operation is terminated. The third circuit may comprise a third transistor which has a first electrode that is connected to the first bitline, a second electrode that is connected to the predetermined voltage and a control electrode which is responsive to the first precharge signal. The fourth circuit may comprise a fourth transistor which has a first electrode that is connected to the second bitline and a second electrode that is connected to the predetermined voltage and a control electrode which is responsive to the second precharge signal. The semiconductor memory device may be configured to turn on the fourth transistor after the sensing operation is terminated in response to the second precharge signal so that the second bitline is precharged to the predetermined voltage.

Pursuant to further embodiments of the present invention, semiconductor memory devices having an open bitline architecture are provided that include a first memory cell array, a second memory cell array and a pair of bitlines comprising a first bitline of the first memory cell array and a second bitline of the second memory cell array. A sense amplifier is connected between the pair of bitlines. The semiconductor memory device further includes a first circuit that is configured to generate a first control signal, a second circuit that is configured to generate a second control signal, a third circuit that is configured to independently control the connection of the first bitline to the sense amplifier and the connection of the second bitline to the sense amplifier in response to the first control signal and a fourth circuit that is configured to independently precharge the first bitline and the second bitline in response to the second control signal. The first circuit generates the first control signal after the termination of a sensing operation performed on the first memory cell array, which is activated, in order to disconnect the second bitline from the sense amplifier, and the second circuit generates the second control signal in order to precharge the second bitline.

In certain embodiments, the third circuit may comprise a first separation unit that is configured to control the connection of the first bitline to the sense amplifier and a second separation unit that is configured to control the connection of the second bitline to the sense amplifier. Likewise, the fourth circuit may comprise a first precharge unit that is configured to precharge the first bitline to a predetermined voltage and a second precharge unit that is configured to precharge the second bitline to the predetermined voltage. The first separation unit may comprise a first transistor that comprises a first electrode connected to the first bitline and a second electrode connected to the sense amplifier. The second separation unit may comprise a second transistor that comprises a first electrode connected to the second bitline and a second electrode connected to the sense amplifier.

In certain embodiments, the first circuit may comprise a first control signal generation unit that is configured to generate a first separation control signal that is applied to a control electrode of the first transistor and a second control signal generation unit that is configured to generate a second separation control signal that is applied to a control electrode of the second transistor. The second transistor may be turned off in response to transition of the level of the second separation control signal after the sensing operation is terminated. The first precharge unit may comprise a third transistor which comprises a first electrode connected to the first bitline and a second electrode connected to the predetermined voltage. The second precharge unit may comprise a fourth transistor which comprises a first electrode connected to the second bitline and a second electrode connected to the predetermined voltage.

The second circuit may comprise a first precharge signal generation unit which generates a first precharge signal that is applied to a control electrode of the third transistor and a second precharge signal generation unit which generates a second precharge signal that is applied to a control electrode of the fourth transistor, wherein the first and second precharge signals together comprise the second control signal. After the sensing operation is terminated, the fourth transistor may be turned on in response to transition of the level of the second precharge signal so that the second bitline is precharged to the predetermined voltage.

Pursuant to still further embodiments of the present invention, methods of controlling bitlines of a semiconductor memory device which has an open bitline architecture are provided. The semiconductor memory device may comprise a sense amplifier connected between a pair of bitlines, consisting of a first bitline of a first memory cell array and a second bitline of a second memory cell array that is adjacent to the first memory cell array. In these methods a difference between the voltages of the pair of bitlines is sensed in response to a command to read data from the first memory cell array. The second bitline is disconnected from the sense amplifier after the sensing is terminated. Then, the second Bitline is precharged. Before the sensing occurs, the first bitline and the second bitline may be connected to the sense amplifier and a precharge operation performed on the first bitline and the second bitline may be stopped.

In these methods, the connection of the first bitline to the sense amplifier may be controlled by a first control signal that is different from a second control signal that is used to control the connection of the second bitline to the sense amplifier. The precharging of the first bitline may be controlled by a first control signal that is different from a second control signal that is used to precharge the second bitline.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 1:
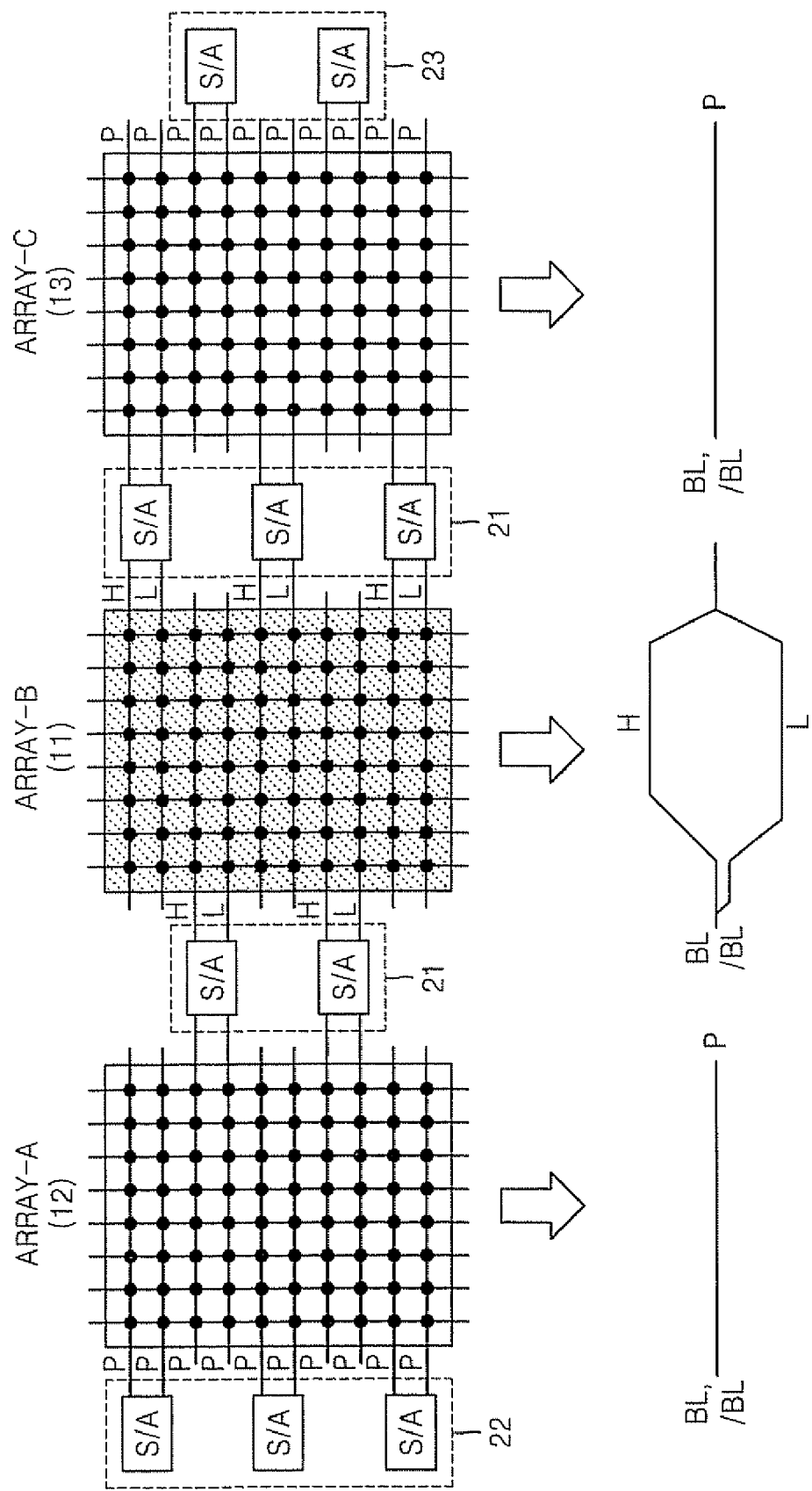
FIG. 1 is a diagram illustrating a sensing operation performed by a conventional semiconductor memory device having a folded bitline architecture.
Figure 2:
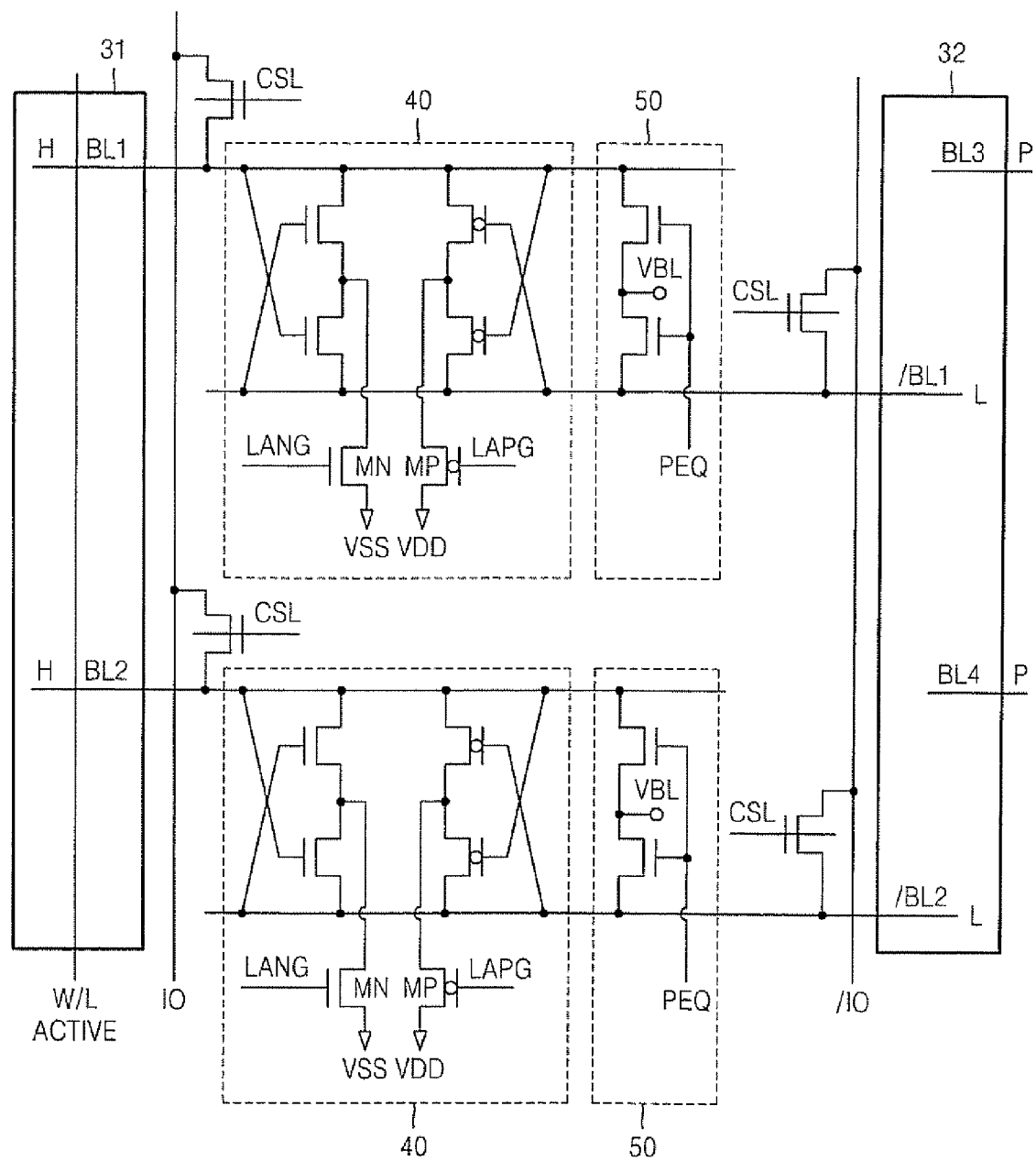
FIG. 2 is a circuit diagram of a conventional semiconductor memory device having an open bitline architecture.
Figure 3:
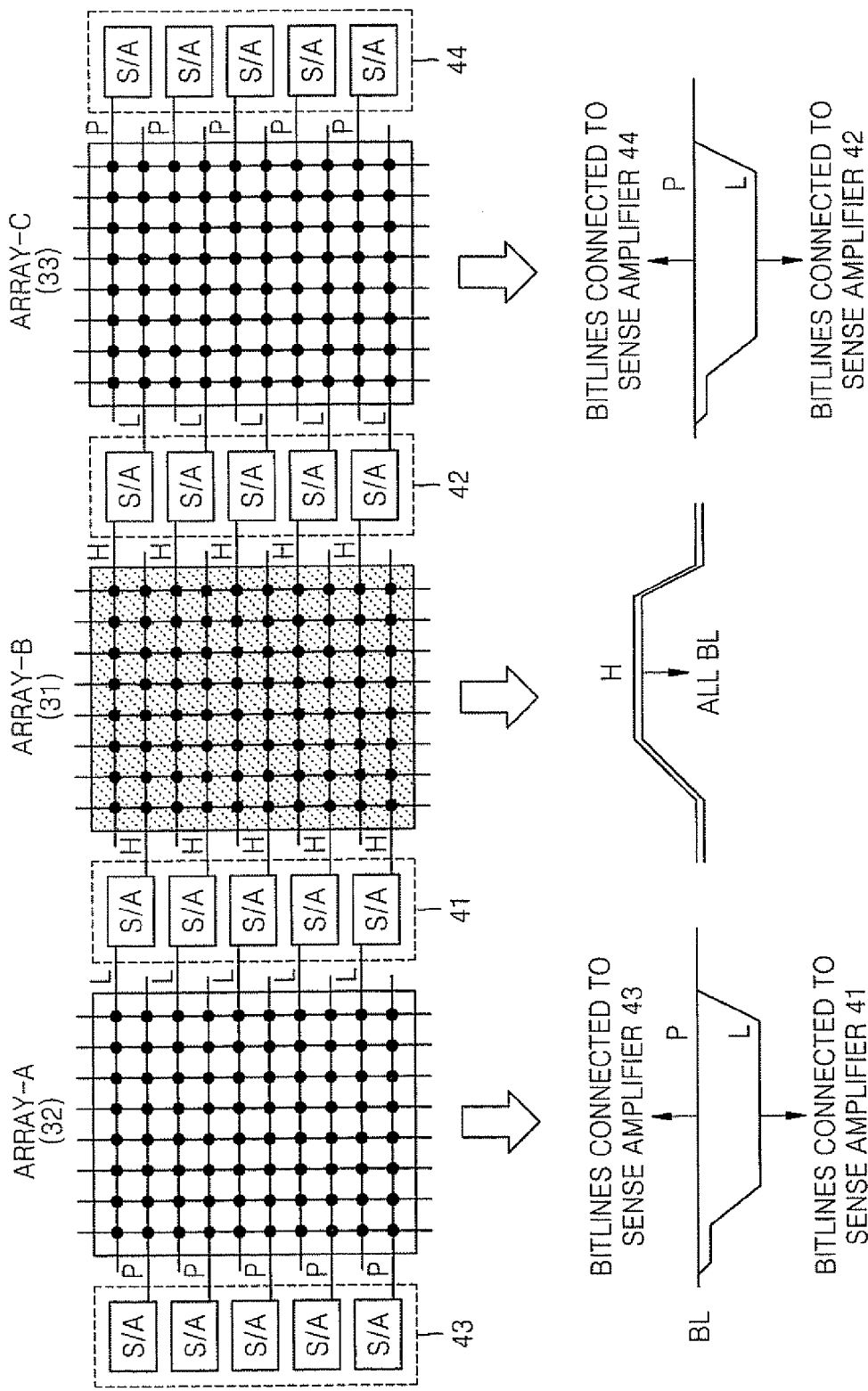
FIG. 3 is a diagram illustrating an embodiment of a sensing operation performed by a conventional semiconductor memory device having an open bitline architecture.
Figure 4:
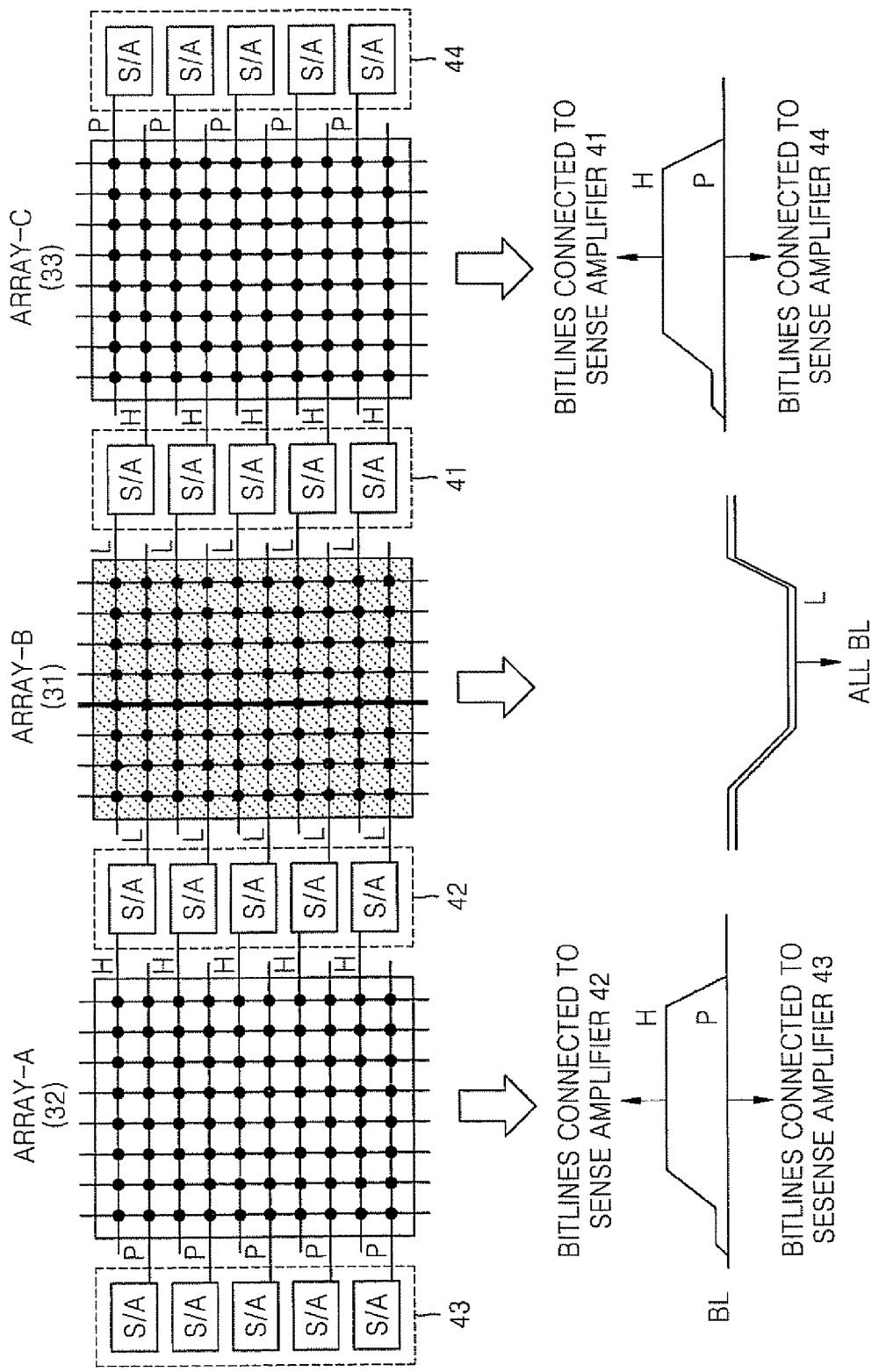
FIG. 4 is a diagram illustrating another embodiment of the sensing operation performed by the conventional semiconductor memory device having an open bitline architecture.
Figure 5:
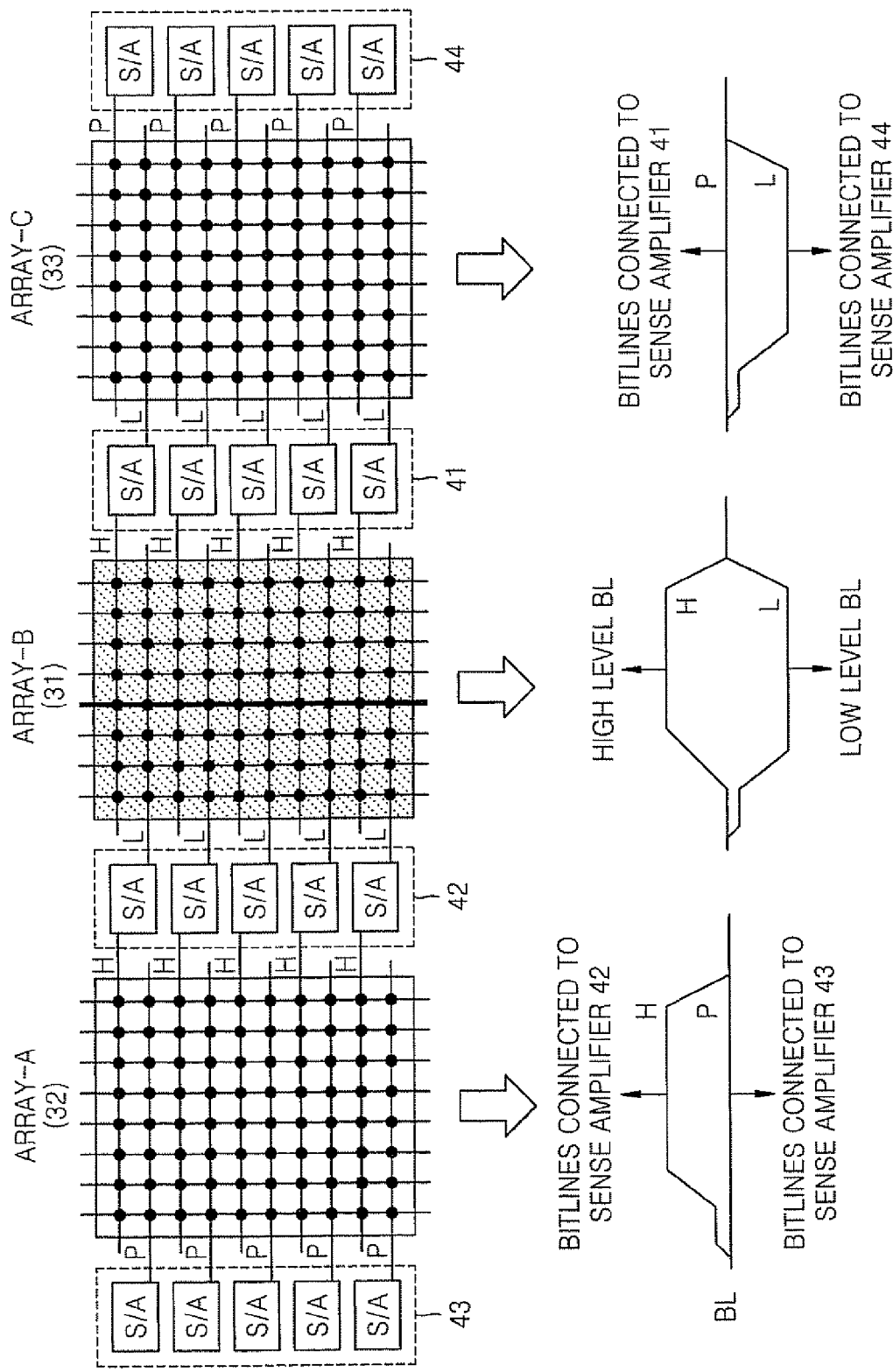
FIG. 5 is a diagram illustrating another embodiment of the sensing operation performed by the conventional semiconductor memory device having an open bitline architecture.
Figure 6:
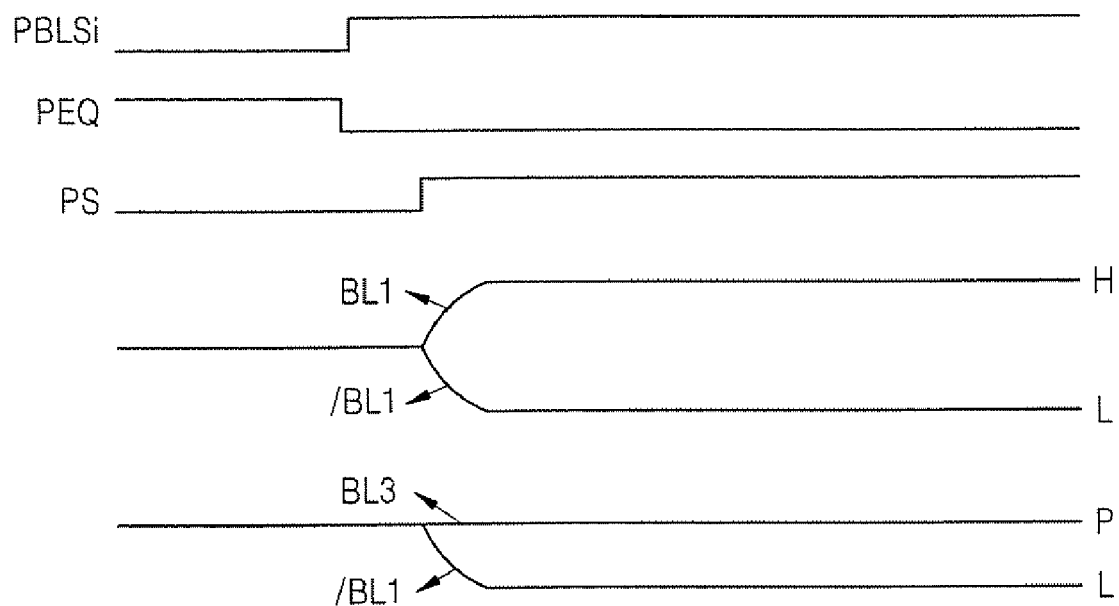
FIG. 6 is a waveform diagram for explaining a sensing operation performed by the conventional semiconductor memory device of FIG. 2.
Figure 7:
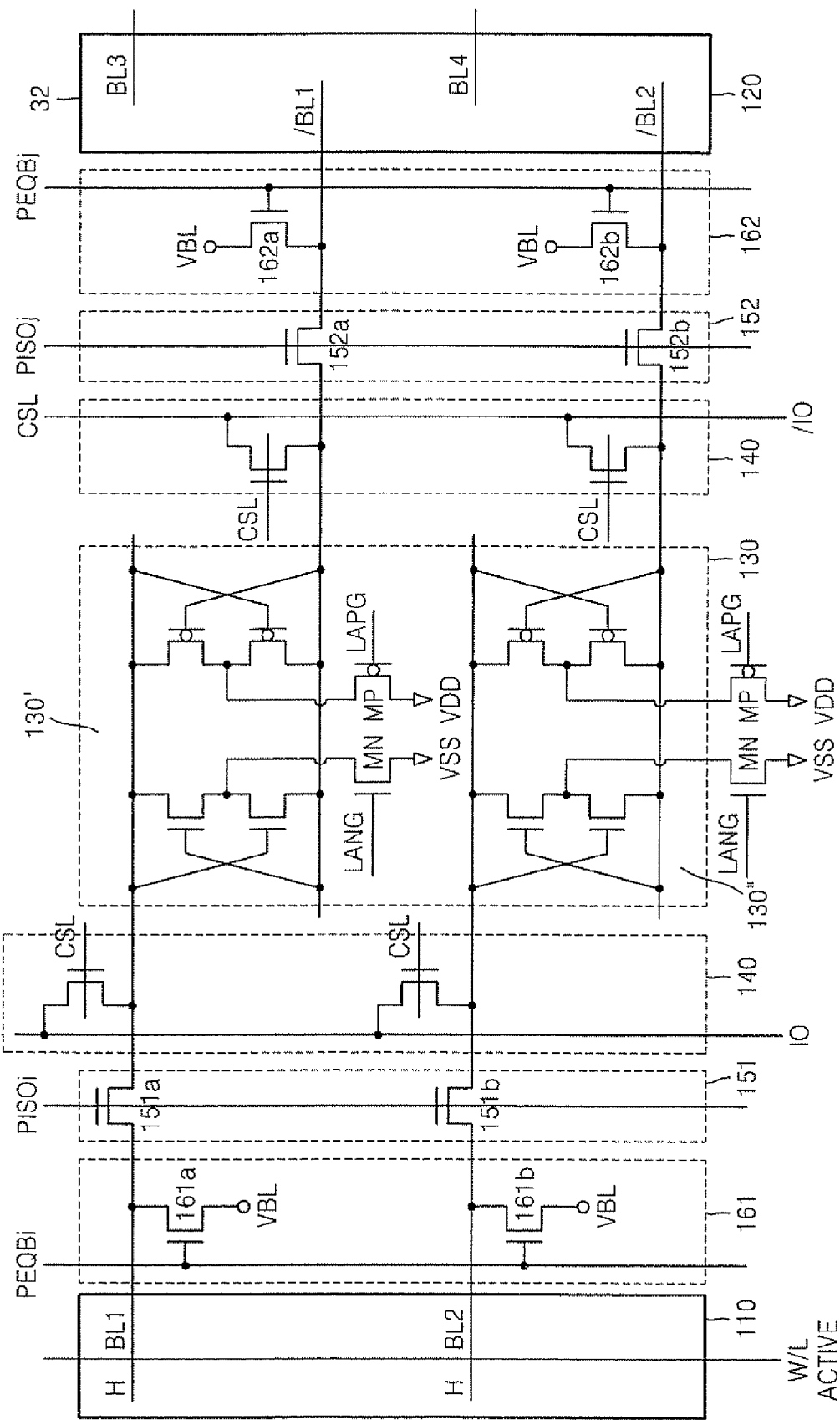
FIG. 7 is a circuit diagram of a semiconductor memory device having an open bitline architecture according to some embodiments of the present invention.

FIG. 7 is a circuit diagram of a semiconductor memory device having an open bitline architecture according to some embodiments of the present invention. As shown in FIG. 7, the semiconductor memory device includes one or more memory cell arrays, i.e., a first memory cell array 110 and a second memory cell array 120. The semiconductor memory device also includes a sense amplifier block 130 which comprises a first sense amplifier 130' connected between a first pair of bitlines (bitline BL1 of the first memory cell array 110 and bitline /BL1 of the second memory cell array 120) and a second sense amplifier 130" connected between a second pair of bitlines, (bitline BL2 of the first memory cell array and bitline /BL2 of the second memory cell array). For convenience of explanation, the operation of the sense amplifier block 130 will now be described in detail, focusing mainly on the operation of the first sense amplifier 130' connected between the bitlines BL1 and /BL1.

The first sense amplifier 130' senses a difference between the voltage of the bitline BL1 and the voltage of the bitline /BL1, amplifies the sensed voltage difference, and outputs the result of the amplification operation. The sense amplifier 130' comprises an N-type sense amplifier and a P-type sense amplifier. A pull-down signal LANG is used for controlling a pull-down transistor MN connected to the N-type sense amplifier, and a pull-up signal LAPG is used for controlling a pull-up transistor MP connected to the P-type sense amplifier.

The semiconductor memory device also includes: a first separation unit 151 which controls the connection of the bitline BL1 of the first memory cell array 110 to the sense amplifier block 130 in response to a first separation control signal PISOi; and a second separation unit 152 which controls the connection of the bitline /BL1 of the second memory cell array 120 to the sense amplifier block 130 in response to a second separation control signal PISOj.

In addition, the semiconductor memory device also includes: a first precharge unit 161 which precharges the bitline BL1 to a predetermined voltage VBL in response to a first precharge signal PEQBi; and a second precharge unit 162 which precharges the bitline /BL1 to the predetermined voltage VBL in response to a second precharge signal PEQBj.

A column selection line CSL transmits a signal for controlling a column selection gate 140. When the column selection gate 140 is turned on in response to the signal transmitted by the column selection line CSL, the bitlines BL1 and/BL1 are connected to data I/O lines I/O and I/O, respectively.

Since the semiconductor memory device of FIG. 7 adopts an open bitline architecture, the sense amplifier 130 is connected between the bitline BL1 of the first memory cell array 110 and the bitline /BL1 of the second memory cell array 120. Accordingly, when the first memory cell array 110 is activated and a sensing operation is initiated, the voltage of the bitline BL1 and the voltage of the bitline /BL1 differ from each other. If a memory cell in the first memory cell array 110 to which the bitline BL1 is connected stores logic-high data, the bitline BL1 reaches a high voltage, and the bitline /BL1 reaches a low voltage.

When this occurs, bitlines BL3 and BL4, which, as shown in FIG. 7, are included in the second memory cell array 120 and are not connected to the sense amplifier block 130, maintain a predetermined voltage VBL, i.e., a precharge voltage. Therefore, in the second memory cell array 120, bitlines having the low voltage and bitlines having the precharge voltage VBL coexist. As a result, a dynamic defect may occur in the second memory cell array 120 when wordline noise is generated.

Such defects may be reduced and/or prevented as the semiconductor memory device may also include the first and second separation units 151 and 152 and the first and second precharge units 161 and 162. In particular, when a sensing operation performed on the first memory cell array 110 is terminated, the second separation unit 152 disconnects the bitline /BL1 of the second memory cell array 120 from the sense amplifier block 130, and the second precharge unit 162 precharges the bitline /BL1 of the second memory cell array 120.

While this occurs, the first separation unit 151 maintains the connection of the bitline BL1 of the first memory cell array 110 to the sense amplifier block 130, thereby enabling the sensing operation to be continuously performed.

As shown in FIG. 7, the first separation unit 151 may comprise, for example, ia first separation transistor 151a which may comprise an NMOS transistor. The first separation transistor 151a includes first and second electrodes which are connected to the bitline BL1 of the first memory cell array 110 and the sense amplifier block 130, respectively, and a control electrode which receives the first separation control signal PISOi.

Likewise, the second separation unit 152 may comprise, for example, a second separation transistor 152a which includes first and second electrodes which are connected to the bitline /BL1 of the second memory cell array 120 and the sense amplifier block 130, respectively, and a control electrode which receives the second separation control signal PISOj.

The first precharge unit 161 may comprise, for example, a first equalization transistor 161a which comprises first and second electrodes that are connected to the bitline BL1 of the first memory cell array 110 and the precharge voltage VBL, respectively. The second precharge unit 162 may comprise, for example, a second equalization transistor 162a which comprises first and second electrodes that are connected to the bitline /BL1 of the second memory cell array 120 and the precharge voltage VBL, respectively. The first and second precharge units 161 and 162 may be controlled in response to the first and second precharge signals PEQBi and PEQBj, respectively, which are different from each other. Thus, the bitline BL1 of the first memory cell array 110 and the bitline /BL1 of the second memory cell array 120 can be precharged independently of each other.

Figure 8:
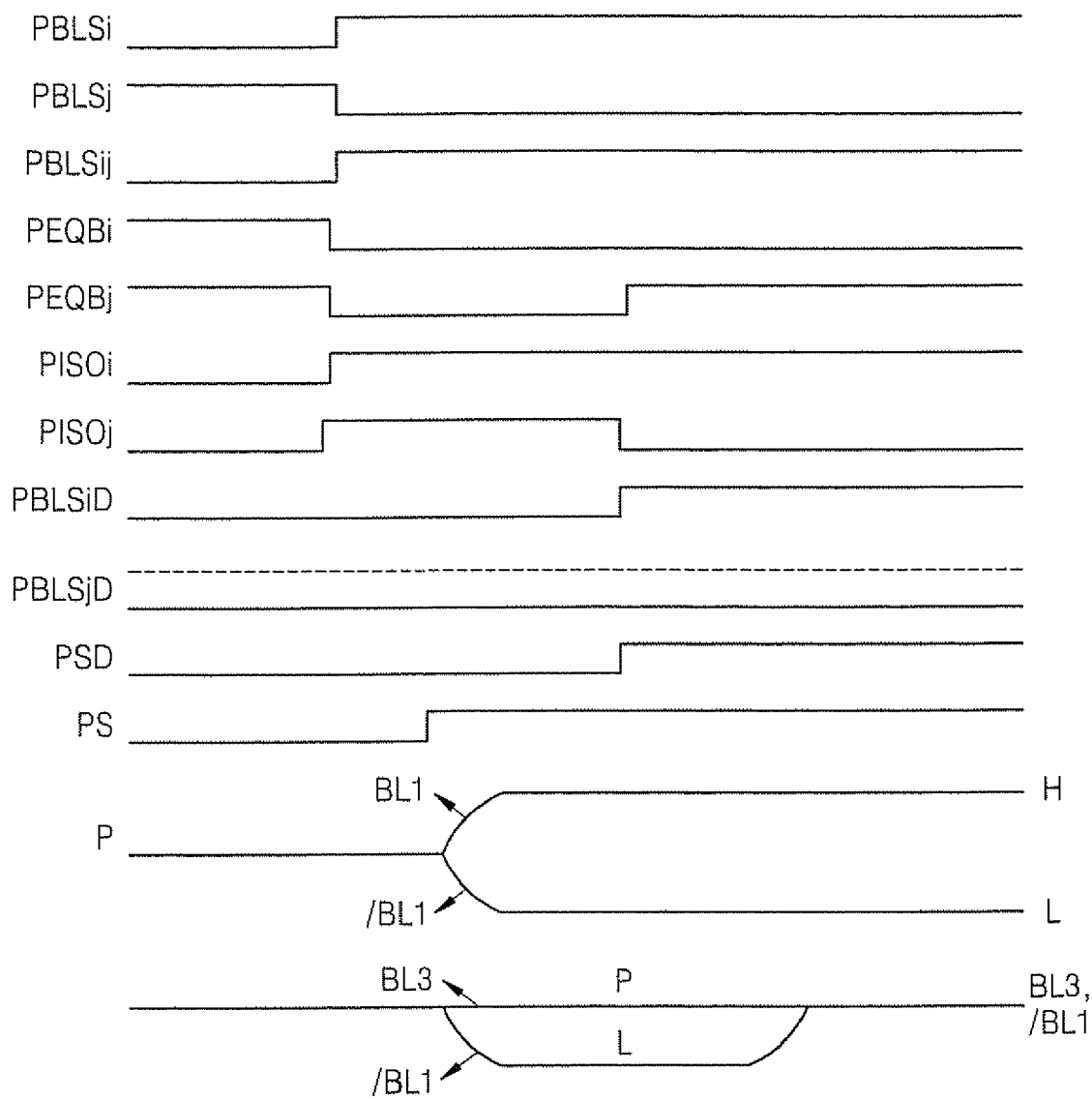
FIG. 8 is a waveform diagram for explaining a sensing operation performed by a semiconductor memory device according to embodiments of the present invention.

A sensing operation of the semiconductor memory device of FIG. 7 will now be described in detail with reference to the waveform diagram of FIG. 8. Referring to FIG. 8, when the first memory cell array selection signal PBLSi becomes logic high, the first memory cell array 110 is activated, and a second memory cell array selection signal PBLSj becomes logic low, and a signal PBLSij becomes logic high. The signal PBLSij becomes logic high whenever one of the first and second memory cell arrays 110 and 120 is activated.

In addition, when the first memory cell array selection signal PBLSi becomes logic high, the first and second separation control signals PISOi and PISOj become logic high. The first and second separation units 151 and 152 receive the first and second separation control signals PISOi and PISOj, respectively, and connect the bitline BL1 of the first memory cell array 110 and the bitline /BL1 of the second memory cell array 120, respectively, to the sense amplifier block 130.

Moreover, when the first memory cell array selection signal PBLSi becomes logic high, the first and second precharge signals PEQBi and PEQBj become logic low. The first and second precharge units 161 and 162 receive the first and second precharge signals PEQBi and PEQBj, respectively, and the precharging of the bitline BL1 of the first memory cell array 110 and the bitline /BL1 of the second memory cell array 120 stops.

When the sensing initiation signal PS becomes logic high, a sensing operation is performed. Once the sensing operation is initiated, the voltage of the bitline BL1 of the first memory cell array 110 and the voltage of the bitline /BL1 of the second memory cell array 120 begin to differ from each other. For example, if a memory cell to which the bitline BL1 is connected stores logic-high data, the bitline BL1 reaches a high voltage H, and the bitline /BL1 reaches a low voltage L.

Of the bitlines/BL1, BL3, and BL4 of the second memory cell array 120, the bitlines BL3 and BL4 are not connected to the sense amplifier block 130 and thus maintain a precharge voltage P, i.e., the voltage VBL.

When the sensing operation is terminated such that there is a sufficient difference between the voltage of the bitline BL1 and the voltage of the bitline /BL1, a signal PSD becomes logic high. The waveform of the signal PSD is similar to a waveform obtained by delaying the sensing initiation signal PS for a predetermined period of time.

In addition, a signal PBLSiD is generated based on the first memory cell array selection signal PBLSi and the signal PSD. The waveform of the signal PBLSiD is similar to a waveform obtained by delaying the first memory cell array selection signal PBLSi for a predetermined period of time. In addition, a signal PBLSjD is generated based on the second memory cell array selection signal PBLSj and the signal PSD.

When the sensing operation is complete, the second separation control signal PISOj becomes logic low in response to the signal PBLSiD. Accordingly, the second separation unit 152 disconnects the bitline /BL1 of the second memory cell array 120 from the sense amplifier block 130.

Thereafter, the second precharge signal PEQBj becomes logic high. In response, the second precharge unit 162 precharges the bitline /BL1 of the second memory cell array 120 to the precharge voltage P.

Thus, when the sensing operation is complete, the bitline /BL1 of the second memory cell array 120 is disconnected from the sense amplifier block 130 and is independently precharged to the precharge voltage P. Accordingly, all the bitlines of the second memory cell array 120 have the precharge voltage P.

Figure 9:
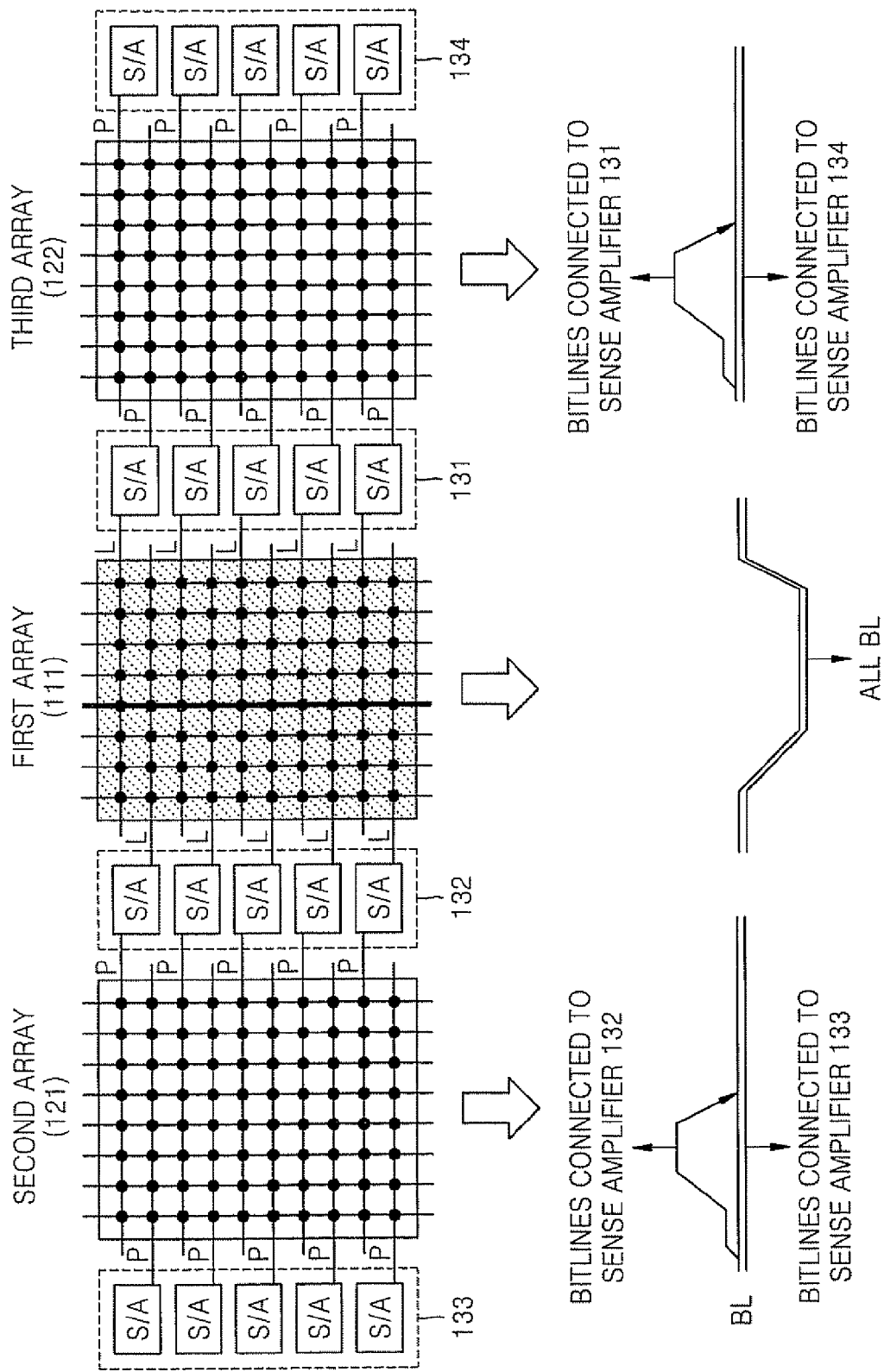
FIG. 9 is a diagram illustrating the voltages of bitlines of a semiconductor memory device according to embodiments of the present invention after a sensing operation performed by the semiconductor memory device is terminated.

FIG. 9 is a diagram illustrating the voltages of bitlines of a semiconductor memory device according to some embodiments of the present invention after a sensing operation is terminated. In FIG. 9, it is assumed that a first memory cell array 111 is activated and second and third memory cell arrays 121 and 122, which are adjacent to the first memory cell array 111, are not activated.

As shown in FIG. 9, if all cell data stored in the first memory cell array 111 is logic low, a plurality of bitlines of the first memory cell array 111 reach a low voltage L due to a sensing operation. During this sensing operation, some of a plurality of bitlines of each of the second and third memory cell arrays 132 and 122 that are connected to sense amplifiers 131 and 132 reach a high voltage H. However, once the sensing operation is terminated, all the bitlines of the second and third memory cell arrays 121 and 122 are precharged to a precharge voltage P. In detail, when the sensing operation is terminated, the bitlines of the second and third memory cell arrays 121 and 122 are precharged from the high voltage H to the precharge voltage P, as illustrated in FIG. 9.

FIGS. 10 through 15 are circuit diagrams of various signal generation circuits that may be used in semiconductor memory devices according to various embodiments of the present invention. The operations of the signal generation circuits illustrated in FIGS. 10 through 15 will now be described with reference to FIG. 8.

Figure 10:
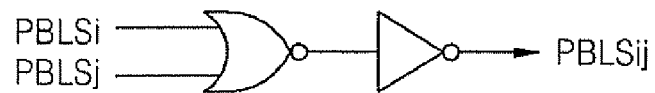
FIG. 10 is a circuit diagram of a circuit according to embodiments of the present invention for performing a logic operation on memory cell array selection signals.

FIG. 10 is a circuit diagram of a circuit according to some embodiments of the present invention that may be used to generate the signal PBLSij. As shown in FIG. 10, the circuit generates the signal PBLSij by performing a NOR operation on the first memory cell array selection signal PBLSi and the second memory cell array selection signal PBLSj and inverting the result of the NOR operation. The signal PBLSij is logic high whenever one of first and second memory cell arrays is activated.

Figure 11:
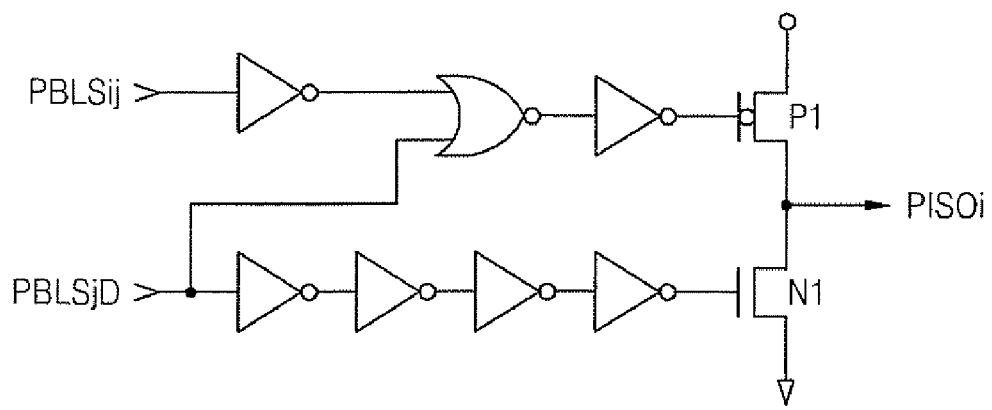
FIG. 11 is a circuit diagram of an embodiment of a circuit for generating a first separation control signal that may be used in a semiconductor memory device according to embodiments of the present invention.

FIG. 11 is a circuit diagram of a circuit according to some embodiments of the present invention that may be used to generate the first separation control signal. As shown in FIG. 11, the circuit generates the first separation control signal PISOi by performing a NOR operation on the inverse of signal PBLSij and the signal PBLSjD and inverting the result of the NOR operation. The signal PBLSjD is a signal obtained by delaying the second memory cell array selection signal PBLSj for a predetermined period of time.

Referring to FIG. 8, when the first memory cell array selection signal PBLSi becomes logic high, a signal applied to a control electrode of a PMOS transistor P1 becomes logic low, and thus, the PMOS transistor P1 is turned on. Accordingly, the first separation control signal PISOi becomes logic high. The logic level of the signal PBLSjD does not change regardless of whether a sensing operation is terminated, and thus, the first separation control signal PISOi maintains a logic high level.

Figure 12:
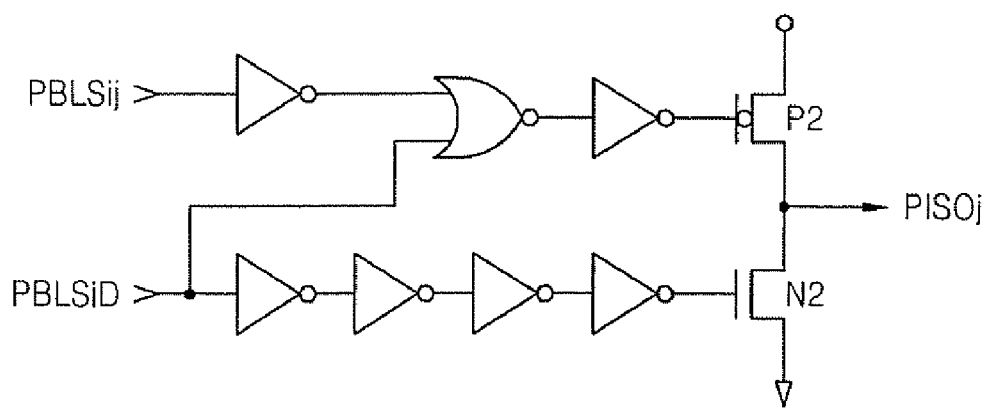
FIG. 12 is a circuit diagram of an embodiment of a circuit for generating a second separation control signal that may be used in a semiconductor memory device according to embodiments of the present invention.

FIG. 12 is a circuit diagram of a circuit according to some embodiments of the present invention that may be used to generate the second separation control signal PISOj. Referring to FIG. 12, when the first memory cell array selection signal PBLSi becomes logic high, the PMOS transistor P2 is turned on, and the second separation control signal PISOj also becomes logic high.

When a sensing operation performed on the first memory cell array 110, which is activated, is terminated such that there is a sufficient difference between the voltages of the bitlines BL1 and/BL1, the logic level of the signal PBLSiD changes from a logic low level to a logic high level. In this case, a PMOS transistor P2 is turned off, and an NMOS transistor N2 is turned on. Therefore, the second separation control signal PISOj becomes logic low. When the second separation control signal PISOj is logic low, the bitlines of the second memory cell array 120 are disconnected from the sense amplifier block 130.

Figure 13:
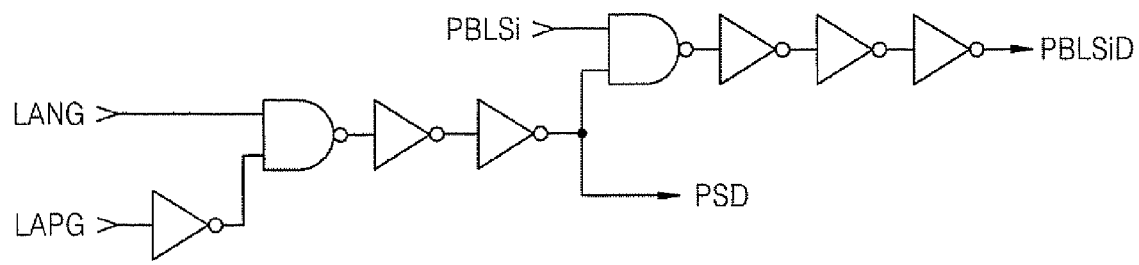
FIG. 13 is a circuit diagram of an embodiment of a circuit for controlling a second separation control signal that may be used in a semiconductor memory device according to embodiments of the present invention.
Figure 14:
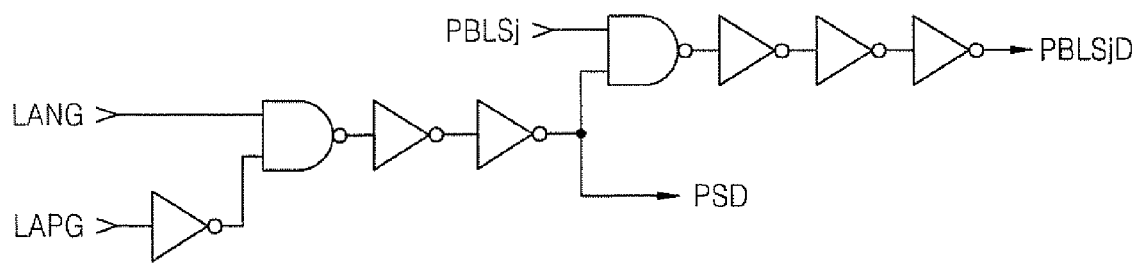
FIG. 14 is a circuit diagram of an embodiment of a circuit for controlling a first separation control signal that may be used in a semiconductor memory device according to embodiments of the present invention.

FIG. 13 is a circuit diagram of a circuit according to some embodiments of the present invention that may be used to generate the signal PBLSiD, and FIG. 14 is a circuit diagram of a circuit according to some embodiments of the present invention that may be used to generate the signal PBLSjD. Referring to FIGS. 13 and 14, the logic levels of the pull-down signal LANG and the pull-up signal LPNG change according to the logic level of the sensing initiation signal PS. The signal PSD is generated by performing a NAND operation on the pull-down signal LANG and the pull-up signal LPNG and inverting the result of the NAND operation. The waveform of the signal PSD is similar to a waveform obtained by delaying the sensing initiation signal PS for a predetermined period of time. The logic level of the signal PSD changes after a sensing operation is completely terminated.

The signal PBLSiD is generated by performing a NAND operation on the first memory cell array selection signal PBLSi and the signal PSD and inverting the result of the NAND operation. The signal PBLSjD is generated by performing a NAND operation on the second memory cell arrays selection signal PBLSj and the signal PSD and inverting the result of the NAND operation.

Referring to FIG. 13, when the first memory cell array selection signal PBLSi is logic high and the logic level of the signal PSD changes, the logic level of the signal PBLSiD changes from a logic low level to a logic high level. The logic level of the second separation control signal PISOj can be controlled according to the logic level of the PBLSiD.

Referring to FIG. 14, since the second memory cell array selection signal PBLSj is logic low, the signal PBLSjD maintains a logic low level regardless of the logic level of the PSD signal.

Figure 15:
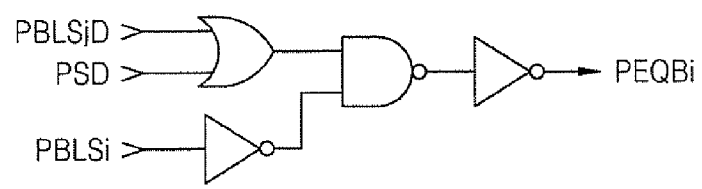
FIG. 15 is a circuit diagram of an embodiment of a first precharge signal generation circuit that may be used in a semiconductor memory device according to embodiments of the present invention.
Figure 16:
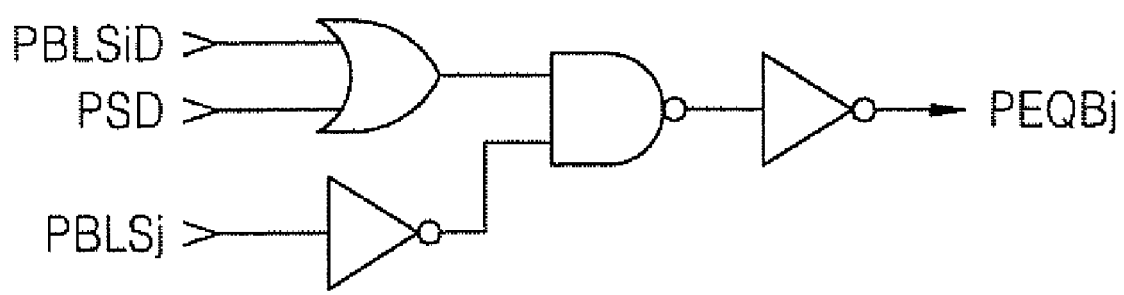
FIG. 16 is a circuit diagram of an embodiment of a second precharge signal generation unit that may be used in a semiconductor memory device according to embodiments of the present invention.

FIG. 15 is a circuit diagram of a circuit according to some embodiments of the present invention that may be used to generate the first precharge signal PEQBi, and FIG. 16 is a circuit diagram of a circuit according to some embodiments of the present invention that may be used to generate the second precharge signal PEQBj. Referring to FIG. 15, when the first memory cell array selection signal PBLSi becomes logic high, the first precharge signal PEQBi becomes logic low, thus stopping a precharge operation performed by the first precharge unit 161. Therefore, even after a sensing operation is terminated, the first precharge unit does not perform a precharge operation.

Referring to FIG. 16, when the logic levels of the signals PSD and the signal PBLSiD change from a logic low level to a logic high level, the logic level of the second precharge signal PEQBj changes from a logic low level to a logic high level. Therefore, all the bitlines of the second memory cell array 120 can be precharged by enabling the second precharge unit 162 to selectively perform a precharge operation after the sensing operation is terminated.

Figure 17:
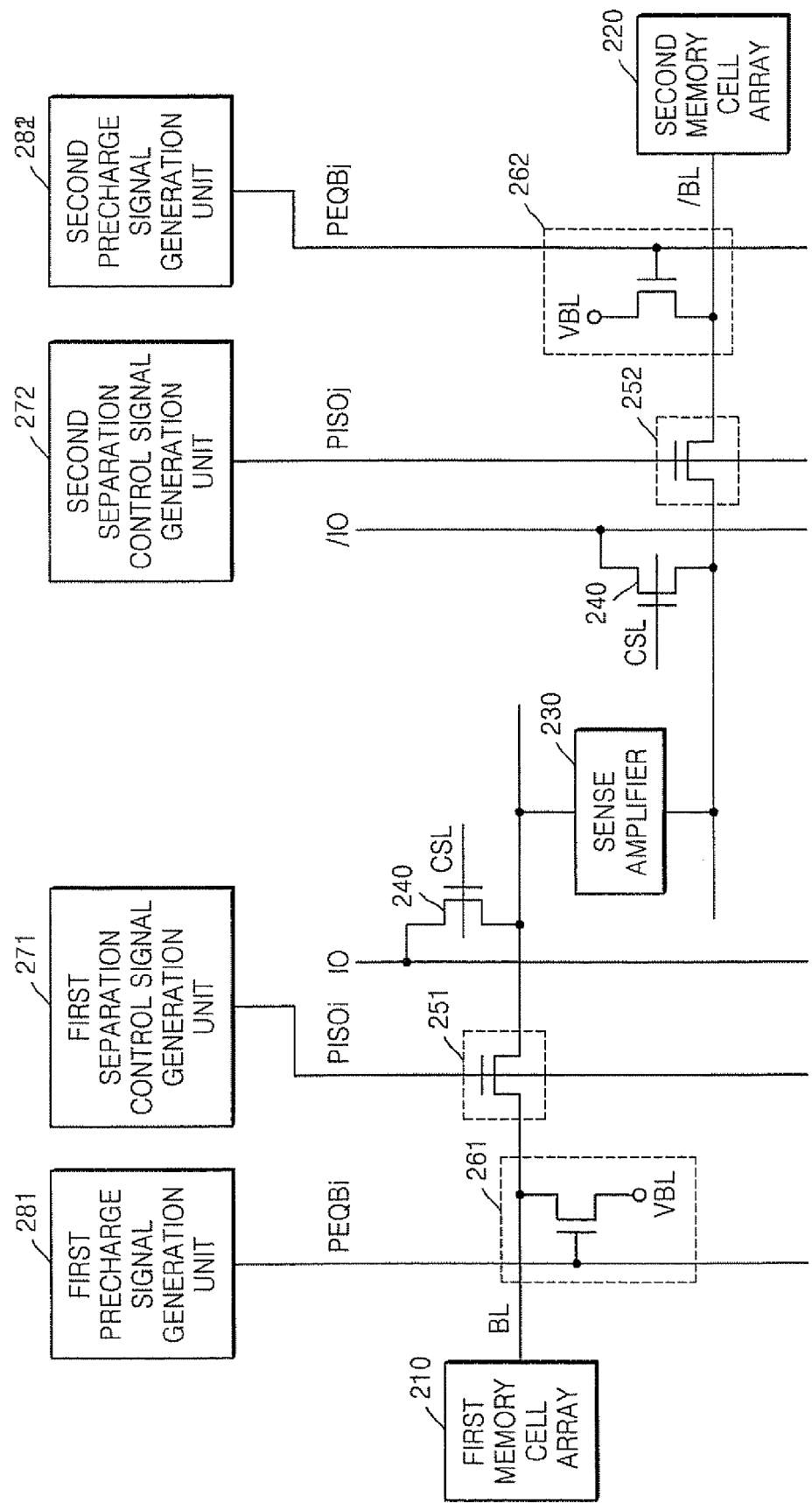
FIG. 17 is a block diagram of a semiconductor memory device according to embodiments of the present invention.

FIG. 17 is a block diagram of a semiconductor memory device according to some embodiments of the present invention. As shown in FIG. 17, the semiconductor memory device includes a sense amplifier 230, a column selection gate 240, a separation unit 251/252, a precharge unit 2611262, a separation control signal generation unit 271/272, and a precharge signal generation unit 281/282.

The sense amplifier 230 is connected between a pair of bitlines, consisting of a bitline BL of a first memory cell array 210 and a bitline /BL of a second memory cell array 220. A column selection line CSL transmits a predetermined signal for controlling the column selection gate 240. The column selection gate 240 is turned on in response to the predetermined signal so that the bitlines BL and /BL are connected to data I/O lines IO and /IO, respectively.

The separation unit comprises a first separation unit 251 and a second separation unit 252. The first separation unit 251 controls the connection of the bitline BL of the first memory cell array to the sense amplifier 230. The second separation unit 252 controls the connection of the bitline /BL of the second memory cell array 220 to the sense amplifier 230.

The precharge unit comprises a first precharge unit 261 and a second precharge unit 262. The first precharge unit 261 precharges the bitline BL of the first memory cell array 210 to a voltage VBL. The second precharge unit 262 precharges the bitline /BL of the second memory cell array 220 to the voltage VBL.

The separation control signal generation unit generates a separation control signal that is applied to the separation unit. The separation control signal generation unit comprises a first separation control signal generation unit 271 and a second separation control signal generation unit 272. The first separation control signal generation unit 271 generates a first separation control signal PISOi for controlling the first separation unit 251, and the second separation control signal generation unit 272 generates the second separation control signal PISOj for controlling the second separation unit 252.

The precharge signal generation unit comprises a first precharge signal generation unit 281 and a second precharge signal generation unit 282. The first precharge signal generation unit 281 generates the first precharge signal PEQBi, which is used for controlling the first precharge unit 261 that precharges the bitline BL of the first memory cell array 210 to the voltage VBL. The second precharge signal generation unit 282 generates the second precharge signal PEQBj, which is used for controlling the second precharge unit 262 that precharges the bitline /BL of the second memory cell array 220 to the voltage VBL.

The first and second separation control signal generation units 271 and 272 independently apply the first and second separation control signals PISOi and PISOj to the first and second separation units 251 and 252, respectively. In addition, the first and second precharge signal generation units 281 and 282 independently apply the first and second precharge signals PEQBi and PEQBj, respectively, to the first and second precharge units 261 and 262, respectively.

When the voltage of the bitline BL differs from the voltage of the bitline /BL due to a sensing operation, the logic level of the second separation control signal PISOj generated by the second separation control signal generation unit 272 changes. Then, the second separation unit 252 disconnects the bitline /BL of the second memory cell array 220 from the sense amplifier 230 in response to the second separation control signal PISOj.

When the sensing operation is terminated, the logic level of the second precharge signal PEQBj generated by the second precharge signal generation unit 282 changes. Then, the second precharge unit 262 precharges the bitline /BL of the second memory cell array 220 in response to the second precharge signal PEQBj.

In this manner, when the sensing operation is terminated, all the bitlines of the second memory cell array 220 can have a precharge voltage.

Figure 18:
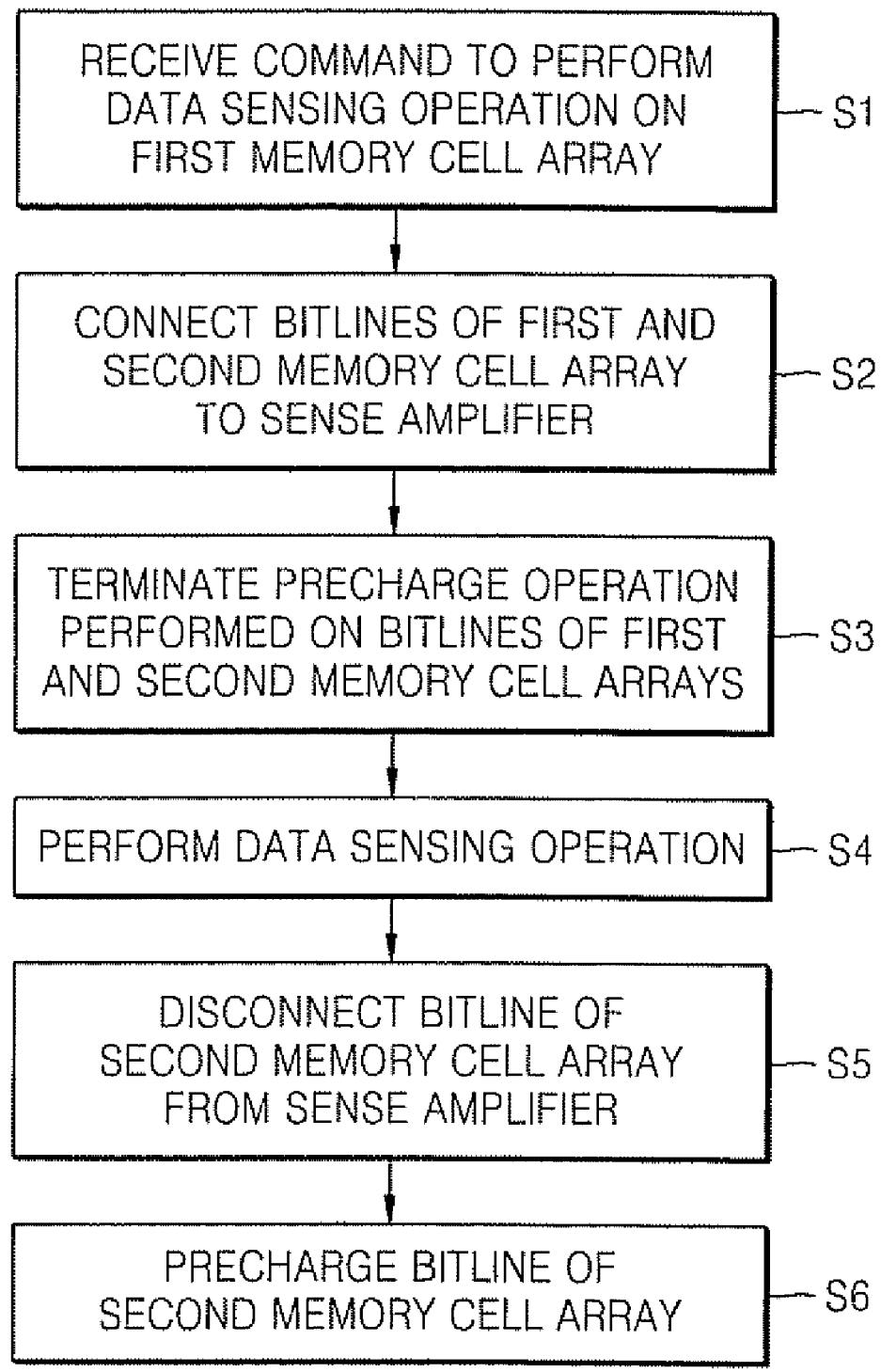
FIG. 18 is a flowchart of a method of controlling bitlines of a semiconductor memory device according to embodiments of the present invention.

FIG. 18 is a flowchart for explaining a method of controlling bitlines of a semiconductor memory device according to an exemplary embodiment of the present invention. Referring to FIG. 18, in operation S1, a command to perform a data sensing operation on a first memory cell array is issued, and a bitline of the first memory cell array is connected to a sense amplifier. In operation S2, a bitline of a second memory cell array that is adjacent to the first memory cell array is connected to the sense amplifier.

In operation S3, a precharge operation performed on the bitlines of the first and second memory cell arrays is terminated. In operation S4, a data sensing operation is initiated.

During the data sensing operation, the voltage of the bitline of the first memory cell array gradually differs from the voltage of the bitline of the second memory cell array. In operation S5, if the data sensing operation is terminated when the difference between the voltages of the bitlines of the first and second memory cell arrays is sufficient to perform a read operation, the second memory cell array is disconnected from the sense amplifier. In operation S6, the bitline of the second memory cell array is precharged to a precharge voltage.

A signal used for controlling the connection of the bitline of the first memory cell array to the sense amplifier may be different from a signal used for controlling the connection of the bitline of the second memory cell array to the sense amplifier.

In addition, a signal used for controlling the precharging of the bitline of the first memory cell array may be different from a signal used for controlling the precharging of the bitline of the second memory cell array.

As described above, according to embodiments of the present invention, it is possible to minimize and/or prevent defects, such as a dynamic defect, from occurring in a semiconductor memory device having an open bitline architecture by making all bitlines of a memory cell array that is adjacent to an activated memory cell array have the same voltage after a sensing operation is terminated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device having an open bitline architecture comprising:
    a first memory cell array;
    a second memory cell array;
    a pair of bitlines comprising a first bitline of the first memory cell array and a second bitline of the second memory cell array;
    a sense amplifier connected between the pair of bitlines;
    a first circuit that is configured to control the connection of the first bitline to the sense amplifier in response to a first control signal;
    a second circuit that is configured to control the connection of the second bitline to the sense amplifier in response to a second control signal;
    a third circuit that is configured to precharge the first bitline to a predetermined voltage in response to a first precharge signal; and
    a fourth circuit that is configured to precharge the second bitline to the predetermined voltage in response to a second precharge signal,
    wherein the second circuit is configured to disconnect the second bitline from the sense amplifier after termination of a sensing operation that is performed on the first memory cell array, which is activated, and
    wherein the fourth circuit precharges the second bitline after the second bitline is disconnected from the sense amplifier.

2. The semiconductor memory device of claim 1, wherein the first circuit comprises a first transistor which has a first electrode that is connected to the first bitline, a second electrode that is connected to the sense amplifier and a control electrode which is responsive to the first control signal.

3. The semiconductor memory device of claim 2, wherein the second circuit comprises a second transistor which has a first electrode that is connected to the second bitline, a second electrode that is connected to and the sense amplifier and a control electrode which is responsive to the second control signal.

4. The semiconductor memory device of claim 3, wherein the semiconductor device is configured to turn off the second transistor after the sensing operation is terminated.

5. The semiconductor memory device of claim 1, wherein the third circuit comprises a third transistor which has a first electrode that is connected to the first bitline, a second electrode that is connected to the predetermined voltage and a control electrode which is responsive to the first precharge signal.

6. The semiconductor memory device of claim 5, wherein the fourth circuit comprises a fourth transistor which has a first electrode that is connected to the second bitline and a second electrode that is connected to the predetermined voltage and a control electrode which is responsive to the second precharge signal.

7. The semiconductor memory device of claim 6, wherein the semiconductor device is configured to turn on the fourth transistor after the sensing operation is terminated in response to the second precharge signal so that the second bitline is precharged to the predetermined voltage.

8. A semiconductor memory device having an open bitline architecture comprising:
    a first memory cell array;
    a second memory cell array;
    a pair of bitlines comprising a first bitline of the first memory cell array and a second bitline of the second memory cell array;
    a sense amplifier connected between the pair of bitlines;
    a first circuit that is configured to generate a first control signal;
    a second circuit that is configured to generate a second control signal;
    a third circuit that is configured to independently control the connection of the first bitline to the sense amplifier and the connection of the second bitline to the sense amplifier in response to the first control signal; and
    a fourth circuit that is configured to independently precharge the first bitline and the second bitline in response to the second control signal,
    wherein, after the termination of a sensing operation performed on the first memory cell array, which is activated, the second bitline is disconnected from the sense amplifier, and is precharged to a predetermined voltage.

9. The semiconductor memory device of claim 8, wherein the third circuit comprises:
    a first separation unit that is configured to control the connection of the first bitline to the sense amplifier; and
    a second separation unit that is configured to control the connection of the second bitline to the sense amplifier.

10. The semiconductor memory device of claim 9, wherein the fourth circuit comprises:

a first precharge unit that is configured to precharge the first bitline to a predetermined voltage; and a second precharge unit that is configured to precharge the second bitline to the predetermined voltage.

11. The semiconductor memory device of claim 10, wherein the first separation unit comprises a first transistor that comprises a first electrode connected to the first bitline and a second electrode connected to the sense amplifier.

12. The semiconductor memory device of claim 11, wherein the second separation unit comprises a second transistor that comprises a first electrode connected to the second bitline and a second electrode connected to the sense amplifier.

13. The semiconductor memory device of claim 12, wherein the first circuit comprises:

a first control signal generation unit that is configured to generate a first separation control signal that is applied to a control electrode of the first transistor; and a second control signal generation unit that is configured to generate a second separation control signal that is applied to a control electrode of the second transistor, wherein the first and second separation control signals together comprise the first control signal.

14. The semiconductor memory device of claim 13, wherein the second transistor is turned off in response to transition of the level of the second separation control signal after the sensing operation is terminated.

15. The semiconductor memory device of claim 10, wherein the first precharge unit comprises a third transistor which comprises a first electrode connected to the first bitline and a second electrode connected to the predetermined voltage.

16. The semiconductor memory device of claim 15, wherein the second precharge unit comprises a fourth transistor which comprises a first electrode connected to the second bitline and a second electrode connected to the predetermined voltage.

17. The semiconductor memory device of claim 16, wherein the second circuit comprises:

a first precharge signal generation unit which generates a first precharge signal that is applied to a control electrode of the third transistor; and a second precharge signal generation unit which generates a second precharge signal that is applied to a control electrode of the fourth transistor, wherein the first and second precharge signals together comprise the second control signal.

18. The semiconductor memory device of claim 17, wherein, after the sensing operation is terminated, the fourth transistor is turned on in response to transition of the level of the second precharge signal so that the second bitline is precharged to the predetermined voltage.

19. A method of controlling bitlines of a semiconductor memory device which has an open bitline architecture and comprises a sense amplifier connected between a pair of bitlines, consisting of a first bitline of a first memory cell array and a second bitline of a second memory cell array that is adjacent to the first memory cell array, the method comprising:

sensing a difference between the voltages of the pair of bitlines in response to a command to read data from the first memory cell array;

disconnecting the second bitline from the sense amplifier after the sensing is terminated; and precharging the second bitline.

20. The method of claim 19 further comprising, before the sensing:

connecting the first bitline and the second bitline to the sense amplifier; and stopping a precharge operation performed on the first bitline and the second bitline.

21. The method of claim 20, wherein the connection of the first bitline to the sense amplifier is controlled by a first control signal that is different from a second control signal that is used to control the connection of the second bitline to the sense amplifier.

22. The method of claim 20, wherein the precharging of the first bitline is controlled by a first control signal that is different from a second control signal that is used to precharge the second bitline.

23. The method of claim 19, wherein the precharging of the second bitline is performed after second bitline is disconnected from the sense amplifier but before a second sensing operation is performed.

* * * * *